(12) United States Patent
Chung et al.

(10) Patent No.: US 11,978,663 B2
(45) Date of Patent: May 7, 2024

(54) INTEGRATED CIRCUIT INTERCONNECT STRUCTURE HAVING DISCONTINUOUS BARRIER LAYER AND AIR GAP

(71) Applicant: Taiwan Semiconductor Manufacturing Co., Ltd., Hsinchu (TW)

(72) Inventors: Chin-Lung Chung, Taoyuan (TW); Shin-Yi Yang, New Taipei (TW); Ming-Han Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/183,004

(22) Filed: Mar. 13, 2023

(65) Prior Publication Data
US 2023/0230877 A1    Jul. 20, 2023

Related U.S. Application Data

(63) Continuation of application No. 17/213,888, filed on Mar. 26, 2021, now Pat. No. 11,605,558.

(51) Int. Cl.
*H01L 21/768* (2006.01)
*H01L 23/522* (2006.01)
*H01L 23/532* (2006.01)

(52) U.S. Cl.
CPC .. *H01L 21/76834* (2013.01); *H01L 21/76819* (2013.01); *H01L 21/7682* (2013.01); *H01L 21/76832* (2013.01); *H01L 21/76877* (2013.01); *H01L 23/5226* (2013.01); *H01L 23/5329* (2013.01)

(58) Field of Classification Search
CPC ........ H01L 21/76834; H01L 21/76819; H01L 21/7682; H01L 21/76832; H01L 21/76877; H01L 23/5226; H01L 23/5329
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann |
| 8,823,065 B2 | 9/2014 | Wang |
| 8,860,148 B2 | 10/2014 | Hu |
| 9,105,490 B2 | 8/2015 | Wang |
| 9,236,267 B2 | 1/2016 | De |
| 9,236,300 B2 | 1/2016 | Liaw |
| 9,520,482 B1 | 12/2016 | Chang |
| 9,576,814 B2 | 2/2017 | Wu |
| 9,685,368 B2 | 6/2017 | Tsai |
| 9,754,882 B2 * | 9/2017 | Chi ................. H01L 21/76831 |
| 9,941,157 B2 | 4/2018 | Lin |

(Continued)

*Primary Examiner* — Karen Kusumakar
(74) *Attorney, Agent, or Firm* — Haynes and Boone, LLP

(57) ABSTRACT

A semiconductor structure includes a first dielectric layer, a first metallic feature over the first dielectric layer, an air gap over the first dielectric layer and adjacent to the first metallic feature, a second dielectric layer disposed above the air gap and on a sidewall of the first metallic feature, and a third dielectric layer disposed above the air gap and on a sidewall of the second dielectric layer. A lower portion of the first metallic feature is exposed in the air gap. The third and the second dielectric layers are substantially co-planar.

20 Claims, 6 Drawing Sheets

(56) References Cited

U.S. PATENT DOCUMENTS

| | | |
|---|---|---|
| 10,685,873 B2 | 6/2020 | Tung |
| 2007/0246831 A1* | 10/2007 | Gabric ................ H01L 23/5222 |
| | | 257/758 |
| 2010/0130001 A1* | 5/2010 | Noguchi ........... H01L 21/02697 |
| | | 257/E21.584 |
| 2012/0187566 A1 | 7/2012 | Horak |
| 2016/0020176 A1 | 1/2016 | Yang |
| 2021/0098292 A1* | 4/2021 | Nguyen ............ H01L 21/02126 |
| 2022/0108921 A1* | 4/2022 | Bae ..................... H01L 21/7682 |

* cited by examiner

INTEGRATED CIRCUIT INTERCONNECT STRUCTURE HAVING DISCONTINUOUS BARRIER LAYER AND AIR GAP

PRIORITY

This is a continuation of U.S. patent application Ser. No. 17/213,888, filed Mar. 26, 2021, incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, the continuing device miniaturization presents challenges to interconnect structures. In some designs, interconnect structures use metal lines isolated with dielectric layers. As the metal lines get closer to each other, the stray capacitance become larger and the likelihood of shorting the metal lines due to metal diffusion and migration over time also increases. Further, the dielectric layers may include some high-k dielectric materials. These materials also increase the stray capacitance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
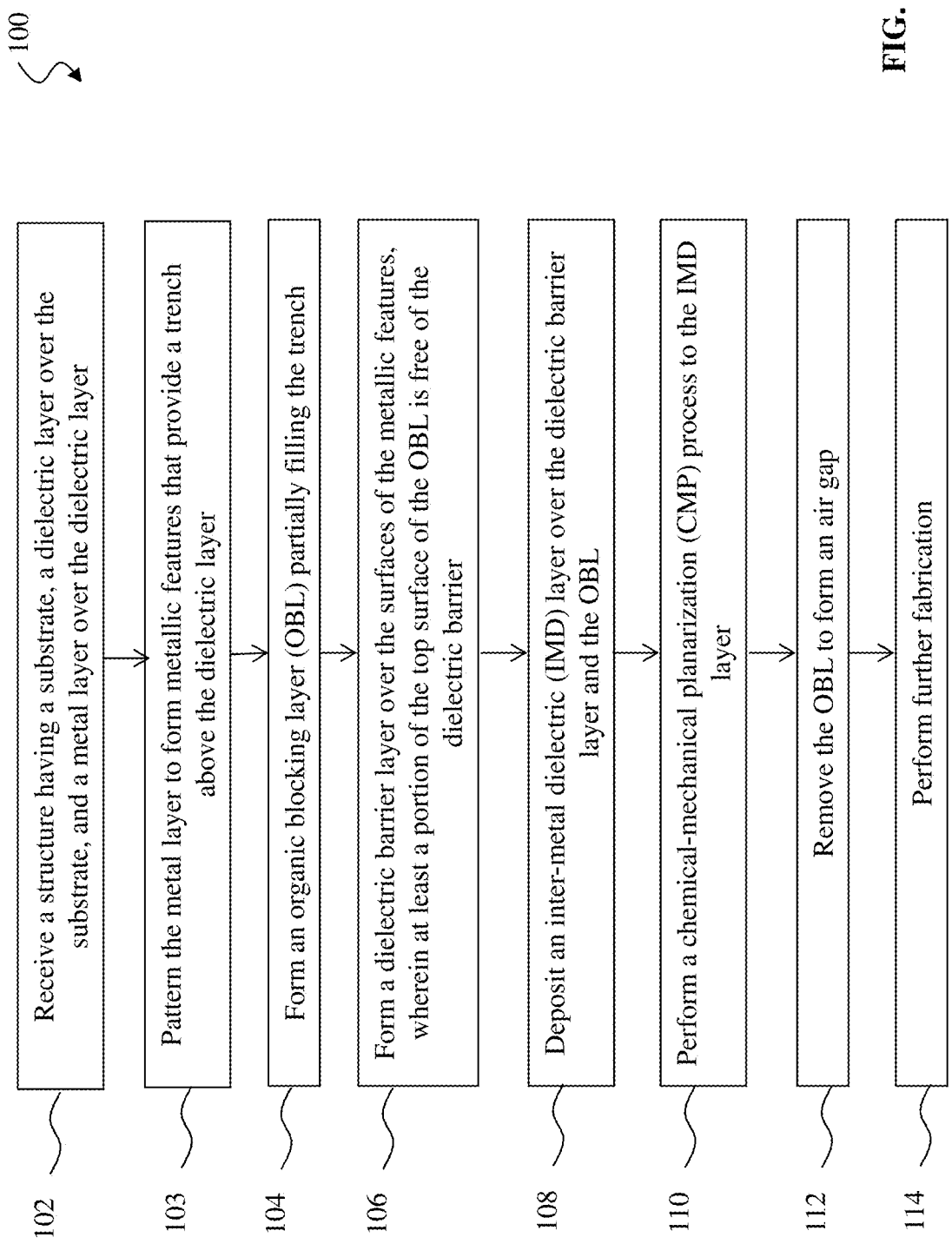
FIG. 1 is a flowchart of a method of fabricating a semiconductor device according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and manufacturing methods thereof. More particularly, the present disclosure is related to semiconductor back-end-of-line (BEOL) processing and interconnect structures. Semiconductor BEOL processing is performed after transistors as well as other active and/or passive devices have been processed in or on a semiconductor substrate. It generally involves forming connectivity network that interconnects the active and/or passive devices. The connectivity network (or interconnect structures) includes multiple layers of metal lines vertically stacked layer by layer. The metal lines of one layer are connected to other metal lines in adjacent layers through metal vias. The metal lines and metal vias are embedded in dielectric layers. Stray capacitance (or parasitic capacitance) unavoidably exists between the metal lines simply because of their proximity to each other. Stray capacitance is more pronounced for metal lines in the same layer as they usually run parallel for a significant length. Stray capacitance is unwanted as it slows down the circuit operation, increases power consumption, and increases coupling noise. Stray capacitance is generally proportional to the dielectric constant of the dielectric material present between the metal lines and inversely proportional to the distance between the metal lines. As the metal lines get closer, new ways of isolating the metal lines are needed, which is an object of the present disclosure.

In some embodiments of the present disclosure, adjacent metal lines in the same layer are isolated by three materials—a high dielectric constant (high-k) material, a low dielectric constant (low-k) material, and air in the form of an air gap. Each material serves its unique purpose. For example, the low-k material provides certain mechanical strength and stability to the metal layer, the high-k material provides a barrier between the metal lines and the low-k material, and the air gap lowers the total effective dielectric constant of the isolation. The air gap also eliminates or reduces the likelihood of metal diffusion or migration between the metal lines. Embodiments of the present disclosure provide improved interconnect structures for highly integrated circuits.

FIG. 1 shows a method 100 of making a semiconductor structure with the new and improved interconnect structure, according to various aspects of the present disclosure. The method 100 is briefly described below. The method 100 includes an operation 102 where an initial structure of an integrated circuit is received or provided. The initial structure includes a semiconductor substrate with active and/or passive devices formed therein or thereon. The initial structure further includes a dielectric layer over the semiconductor substrate. The dielectric layer may have conductive elements such as metal lines and/or vias embedded therein. Over the dielectric layer is a metal layer. The method 100 further includes an operation 103 where the metal layer is patterned into metal lines and trenches are provided between the metal lines and above the dielectric layer. The method 100 further includes an operation 104 where an organic blocking layer (OBL) is deposited to partially fill the trenches. The OBL is decomposable into small molecules under a thermal process or by ultraviolet (UV) irradiation. The method 100 further includes an operation 106 where a dielectric barrier layer is deposited onto the surfaces of the metal lines that are not covered by the OBL. The dielectric barrier layer includes a high-k material in an embodiment. Due to hydrophobic property of the OBL, the dielectric barrier layer is not deposited on the OBL (other than possibly the edge area of the OBL). The method 100 further includes an operation 108 where an inter-metal dielectric (IMD) layer is deposited to fill the trenches. The IMD layer includes a low-k material in an embodiment. The method 100 further includes an operation 110 where the IMD layer is planarized using a chemical-mechanical planarization (CMP) process. The method 100 further includes an operation 112 where the OBL is removed by a thermal process or by UV irradiation. The thermal process or UV irradiation decomposes the OBL into small molecules which subsequently escape through the IMD layer. The space formerly occupied by the OBL becomes an air gap. Thus, an isolation structure is formed between the metal lines. The isolation structure includes the dielectric barrier layer, the IMD layer, and the air gap. The method 100 performs further steps in operation 114 to complete the fabrication of the integrated circuit. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 will be further described below in conjunction with FIGS. 2A-2J which illustrate schematic cross-sectional views of a semiconductor device 200 in various fabrication stages according to the method 100, in accordance with some embodiments.

In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 200 includes a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-2H have been simplified for the sake of clarity to better understand the inventive concepts of the present disclosure. Additional features can be added in the device 200, and some of the features described below can be replaced, modified, or eliminated in other embodiments of the device 200.

Figure 2B:
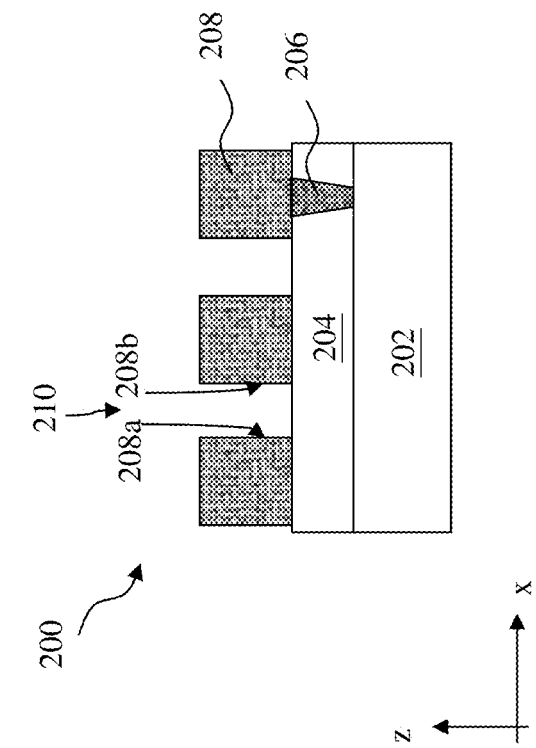
FIGS. 2A, 2B, 2C, 2D, 2E, 2F, 2G, 2H, 2I, and 2J show cross-sectional schematic views of a semiconductor device manufactured by the method of FIG. 1, in accordance with some embodiments.
Figure 2A:
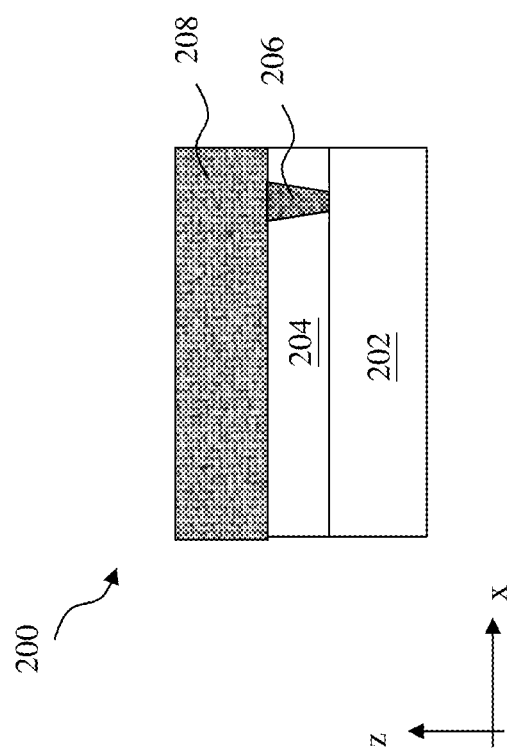

Referring to FIG. 1, at operation 102, the method 100 receives or provides an initial structure of the device 200, an example of which is shown in FIG. 2A. As shown in FIG. 2A, the device 200 includes a substrate 202 and a dielectric layer 204 over the substrate 202. The dielectric layer 204 may include metallic features 206. The device 200 further includes a metal layer 208 over the dielectric layer 204. The metal layer 208 is electrically connected to the metallic features 206. Components of the device 200 are further described below.

In embodiments, the substrate 202 includes a silicon (Si) substrate, such as a silicon wafer. Alternatively, the substrate 202 may comprise another semiconductor, such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP); or combinations thereof. In yet another alternative, the substrate 202 includes a semiconductor on insulator (SOI) substrate.

The substrate 202 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs, nanowire FETs, and nanosheet FETs. The transistors generally include source/drain terminals and gate terminals. The substrate 202 may further include passive devices such as resistors, capacitors, and inductors.

The substrate 202 also includes one or more isolation structures for isolating the various transistors, resistors, capacitors, and inductors. The isolation structures may include shallow trench isolation, deep trench isolation, field oxide, LOCal Oxidation of Silicon (LOCOS), or other suitable structure; and may include silicon oxide ($SiO_2$), silicon nitride ($Si_3N_4$), silicon oxynitride (SiON), fluoride-doped silicate glass (FSG), a low-k dielectric material, and/or other suitable insulating material. The substrate 202 may also include one or more dielectric layers over the various transistors, resistors, capacitors, and inductors. For example, the one or more dielectric layers may include silicon nitride ($Si_3N_4$), silicon oxynitride (SiON), silicon nitride with oxygen (O) or carbon (C) elements, doped or undoped silicate glass, silicon oxide, and/or other materials.

Further, the substrate 202 may include conductors embedded in the one or more dielectric layers, such as source/drain contacts, gate contacts, source/drain contact vias, gate contact vias, metal lines, metal vias, and so on. The conductors provide electrical connectivity to the various transistors, resistors, capacitors, and inductors.

In embodiments, the surface of the dielectric layer 204 includes one or more functional groups that are bondable to silane. For example, the dielectric layer 204 includes silanol (Si—O—H) in an embodiment. In some embodiments, the dielectric layer 204 includes an oxide (i.e., silicon oxide), in which case the dielectric layer 204 may also be referred to as oxide layer 204. For example, the dielectric layer 204 may include materials such as tetraethylorthosilicate (TEOS) formed oxide, un-doped silicate glass, or doped silicon oxide such as borophosphosilicate glass (BPSG), fluoride doped silica glass (FSG), phosphosilicate glass (PSG), boron doped silica glass (BSG), and/or other suitable dielectric materials. The dielectric layer 204 may be deposited by a plasma enhanced chemical vapor deposition (PECVD) process, a flowable chemical vapor deposition (FCVD) process, or other suitable deposition technique.

The metallic features 206 may include metal lines and/or metal vias. The metallic features 206 are embedded in the dielectric layer 204 and electrically connected to various conductive features in the substrate 202. The metallic features 206 may include tungsten (W), cobalt (Co), copper (Cu), other metals, metal nitrides such as titanium nitride (TiN), titanium aluminum nitride (TiAlN), tungsten nitride (WN), tantalum nitride (TaN), or combinations thereof, and may be formed by chemical vapor deposition (CVD), physical vapor deposition (PVD), electro-chemical plating (ECP), electroless plating, and/or other suitable processes. In some embodiments, the metallic features 206 include a layer of metal nitride (e.g., TiN, TiAlN, WN, or TaN) surrounding a layer of metal (e.g., W, Co, or Cu).

The metal layer 208 includes a metal that has low resistance and yet amenable to an etching process, such as reactive ion etching or other etching methods including dry etching and wet etching. For example, the metal layer 208 may include ruthenium (Ru), tungsten (W), molybdenum (Mo), titanium (Ti), cobalt (Co), aluminum (Al), or other metal(s). In some embodiment, the metal layer 208 may include copper (Cu) although Cu may be more difficult to etch than some other metals. In an embodiment, the metal layer 208 is deposited using PVD, CVD, sputtering, ECP, electroless plating, or other suitable processes.

At operation 103, the method 100 (FIG. 1) patterns the metal layer 208 into metallic features, referred to as metallic features 208, such as shown in FIG. 2B. Trenches 210 are provided between adjacent metallic features 208 and above the dielectric layer 204. Some sidewall surfaces 208a and 208b of the metallic features 208 face each other across the trench 210. The metallic features 208 may include metal lines and/or metal vias. In an embodiment, the metallic features 208 are metal lines that are oriented lengthwise into and out of the page of FIG. 2B. The metallic features 208 are provided on the dielectric layer 204. Some of the metallic features 208 are electrically connected to the metallic features 206 in the dielectric layer 204. In an embodiment, the operation 103 includes photolithography and etching processes. For example, a photolithography process may be performed to form an etch mask over the metal layer 208 of FIG. 2A, and the etch mask provides openings corresponding to the trenches 210. An example photolithography process includes coating a photoresist (or resist) layer, soft baking of the resist layer, mask aligning, exposure, post-exposure baking, developing the resist layer to form a resist pattern, rinsing, and drying (e.g., hard baking) the resist pattern. The resist pattern can be used as an etch mask for etching the metal layer 208. Alternatively, the resist pattern can be transferred to another layer (such as an anti-reflective coating layer) underneath, which is used as the etch mask for etching the metal layer 208. Subsequently, the metal layer 208 is etched through the openings of the etch mask to remove portions of the metal layer, forming the trench 210. The remaining portions of the metal layer 208 become the metallic features 208. Each of the metallic features 208 has a top surface and two sidewall surfaces. FIG. 2B illustrates a sidewall surface 208a of a metallic feature 208 faces a sidewall surface 208b of another metallic feature 208. The surfaces 208a and 208b as well as portions of the top surface of the dielectric layer 204 are exposed in the trenches 210. In some embodiments, some of the trenches 210 have a wider opening at its top portion than at its bottom portion.

Figure 2D:
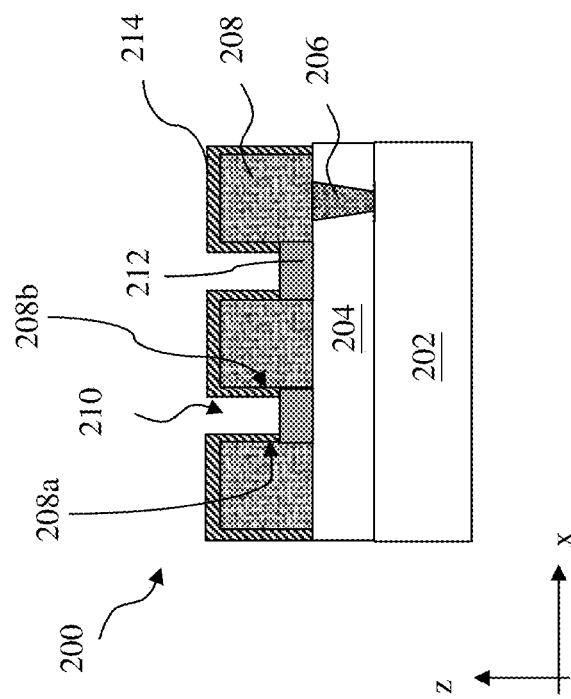
Figure 2C:
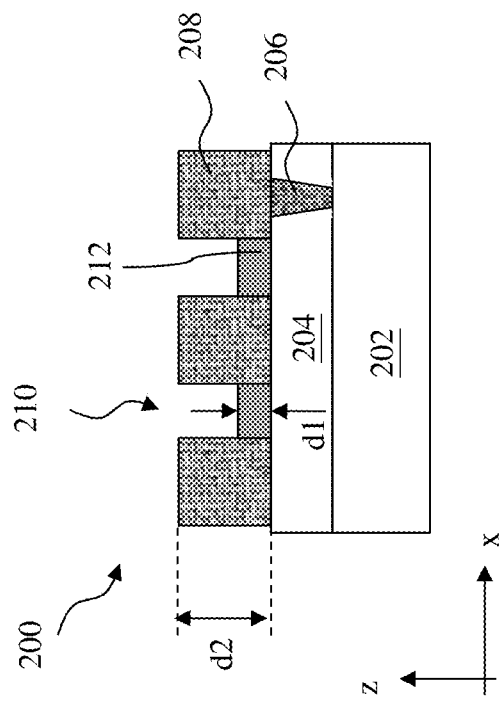

At operation 104, the method 100 (FIG. 1) forms an organic blocking layer (OBL) 212 that partially fills the trenches 210, such as shown in FIG. 2C. In the present embodiment, the OBL 212 includes a material having small molecules, a polymer, or organometallic compounds that can be decomposed into vapor, for example, by heating it up or irradiating it with UV lights. Further, the OBL 212 includes one or more functional groups that are linkable to the surface of the dielectric layer 204, for example, by forming chemical bonds with the dielectric layer 204. In some embodiments, the OBL 212 may include a silane complex composed of reactive silyl ligand for nucleophilic reaction with an oxide layer (which is an example of the dielectric layer 204). Examples of such silane complex (which are organometallic compounds) include $Cr(CO)_5(\eta^2\text{-HSiEt}_3)$, $Mo(CO)_5(\eta^2\text{-HSiEt}_3)$, and $W(CO)_5(\eta^2\text{-HSiEt}_3)$. In an embodiment, the OBL 212 includes silanol functional groups R—Si(OH)x, R is alkyl or aryl group, such as trimethylsilanol, dimethylphenylsilanol, triphenylsilanol and dimethylsilanediol) that are linkable to oxide layer by dehydration. In some embodiments, the OBL 212 includes $Si(OR)_3$ where R is an alkyl group such as methyl, ethyl, propyl, or butyl group. In some embodiments, the OBL layer 212 may include a polymer such as poly(neopentul methacrylate-co-ethylene glycol dimethacrylate) copolymer, polycarbonate, polyester or other suitable material can react with the hydroxyl groups on oxide layer. Still further, the OBL 212 is generally hydrophobic in the present embodiment.

In the present embodiment, the OBL 212 is deposited to only partially fill the trenches 210, while some sidewall surfaces (such as the surfaces 208a and 208b) of the metallic features 208 are still exposed in the trenches 210. The OBL 212 may be deposited using CVD, molecular layer deposition (MLD), or a wet coating method such as spin coating, dipping, blade-coating, and immersion coating. For example, the OBL 212 may be deposited using CVD where small molecules and/or precursors of the OBL 212 react with the dielectric layer 204 (for example, the surface of the dielectric layer 204 includes silanol) to form a thin film of a deposit until a desired thickness of the OBL 212 is reached. Extra molecules and/or precursors are purged by a carrier gas such as argon. For another example, the OBL 212 may be deposited using MLD where a first layer of small molecules or organometallic compounds are deposited to form chemical bonds with the dielectric layer 204, and a second layer of molecules are deposited by linking to the first layer. This may repeat layer-by-layer until a desired thickness of the OBL 212 is reached. In embodiments where the OBL 212 is deposited using a wet coating method, a solution may be prepared by dissolving a material for the OBL 212 in a solvent. The solvent can be protic in an embodiment or aprotic in an alternative embodiment. A protic solvent refers to a solvent having a labile H$^+$, such as a hydrogen atom bound to an oxygen (as in a hydroxyl group), a nitrogen (as in an amine group), or fluoride (as in hydrogen fluoride). An aprotic solvent refers to a solvent that has no labile H. Further, an aprotic solvent can be either polar aprotic or non-polar aprotic. The solution is applied to the device 200 by a wet coating method such as spin coating, dipping, blade-coating, or immersion coating. The material reacts with the dielectric layer 204 to deposit a thin film in the trench 210. Extra solution is washed off from the trench 210. In various embodiments, the OBL 212 is deposited under a temperature below 400° C. because most of the materials suitable for the OBL 212 vaporize or decompose at a temperature higher than 400° C.

In various embodiments, the OBL 212 is deposited to a thickness d1 that is about 2 Å to about 100 Å depending on the materials selected and the depth of the trench 210. As will be discussed, the OBL 212 will be decomposed and removed, thereby forming an air gap in its place. If the OBL 212 is too thin (for example, d1<2 Å), then the air gap might be too small and its effect on capacitance reduction would be greatly diminished. If the OBL 212 is too thick (for example, d1>100 Å), then it might be difficult to decompose and to remove the OBL 212. Thus, the thickness d1 of the OBL 212 is generally designed to be in a range of about 2 Å to about 100 Å. In some embodiments, the thickness d1 may be designed to be a fraction of the depth d2 of the trenches 210 (i.e., the thickness of the metallic features 208). For example, a ratio of d1 to d2 (d1:d2) may be in a range of about 0.25 to about 0.5. If the ratio is too small (such as less than 0.25), then the air gap might be relatively too small and its effect on capacitance reduction would be diminished. If the ratio is too big (such as greater than 0.5), then it might be difficult to decompose and to remove the OBL 212. In some embodiments, the depth d2 is about 20 nm to about 200 nm depending on the level of the metal layer 208 in the device 200. For example, a low metal layer (such as M0 layer) may have metal features as thick as 20 nm, while a high metal layer (such as a top metal layer) may have metal features as thick as 200 nm. To further such embodiments, the thickness d1 may be designed according to the ratio discussed above. In some embodiments, the method 100 includes an etching back process after the OBL 212 is deposited. The etching back process recesses the OBL 212 to a desired thickness. In these embodiments, the OBL 212 may be initially deposited to fill the trenches 210.

At operation 106, the method 100 (FIG. 1) forms a dielectric barrier layer 214 covering the surfaces of the metallic features 208 that are still exposed after the operation 104, such as shown in FIG. 2D. Referring to FIG. 2D, in the present embodiment, the dielectric barrier layer 214 is deposited to have a substantially uniform thickness along the top and sidewall surfaces of the metallic features 208. The dielectric barrier layer 214 functions to isolate the adjacent metallic features 208. Without the dielectric barrier layer 214, metal elements from the metallic features 208 may diffuse into a low-k dielectric layer that is subsequently formed adjacent the metallic features 208, such as the layer 216 in FIG. 2G. Over time, the diffused metal elements may cause short circuit defects. In an embodiment, the dielectric barrier layer 214 includes a high-k dielectric material. High-k dielectric material generally refers to dielectric materials having a high dielectric constant, for example, greater than that of silicon oxide (k≈3.9). In various embodiments, the dielectric barrier layer 214 may include one or more metal nitrides, metal oxides, and/or metal silicide. For example, the dielectric barrier layer 214 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, TaN, TiN or other suitable material(s). The dielectric barrier layer 214 may be deposited using ALD, CVD, PVD, ECP, ELD (electroless deposition), or other suitable methods, and may have a thickness of about 5 Å to about 50 Å in various embodiments, as measured on the sidewalls of the metallic features 208 along the "x" direction. If the dielectric barrier layer 214 is too thin (for example, less than 5 Å), it may not provide sufficient barrier function as discussed above. If the dielectric barrier layer 214 is too thick (for example, greater than 50 Å), it would unnecessarily increase the stray capacitance between the metallic features 208. In an embodiment, due to the hydrophobic property of the OBL 212, the dielectric barrier layer 214 is not deposited on the OBL 212 other than some edge areas of the OBL 212. The dielectric barrier layer 214 may or may not touch the edge areas of the OBL 212. As shown in FIG. 2D, the sidewall surfaces of the metallic features 208 (such as the surfaces 208a and 208b) are covered by the dielectric barrier layer 214 and the OBL 212. The dielectric barrier layer 214 is non-continuous from one metallic feature 208 to another. Each of the trenches 210 is partially filled by the OBL 212 and the dielectric barrier layer 214.

Figure 2F:
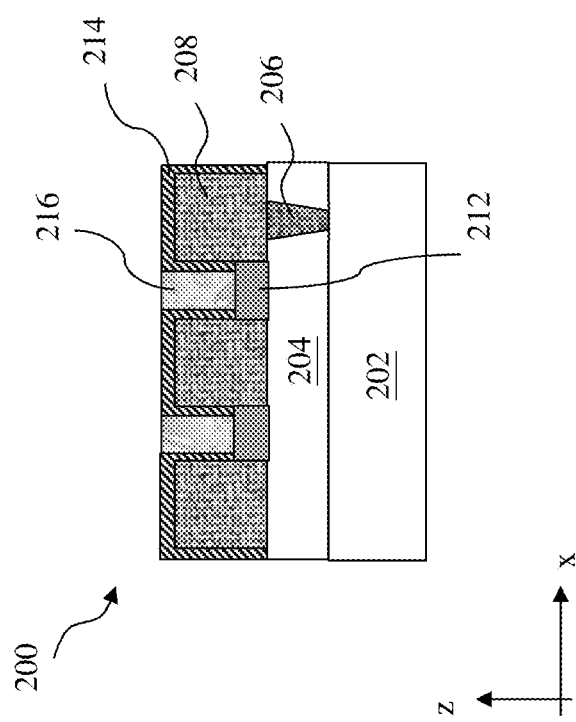
Figure 2E:
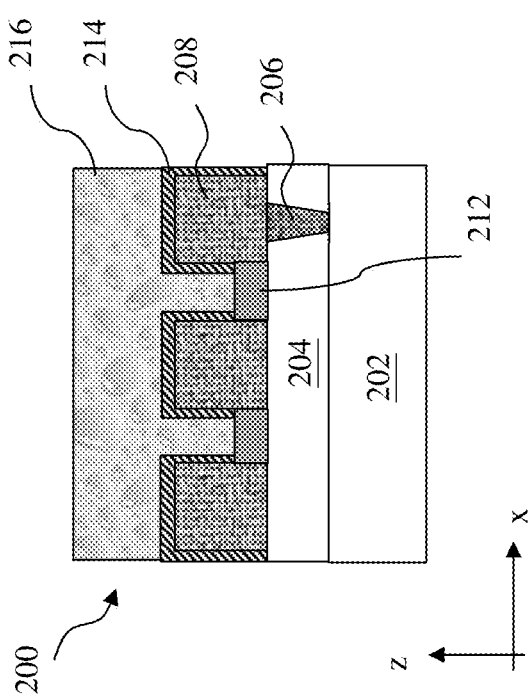
Figure 2H:
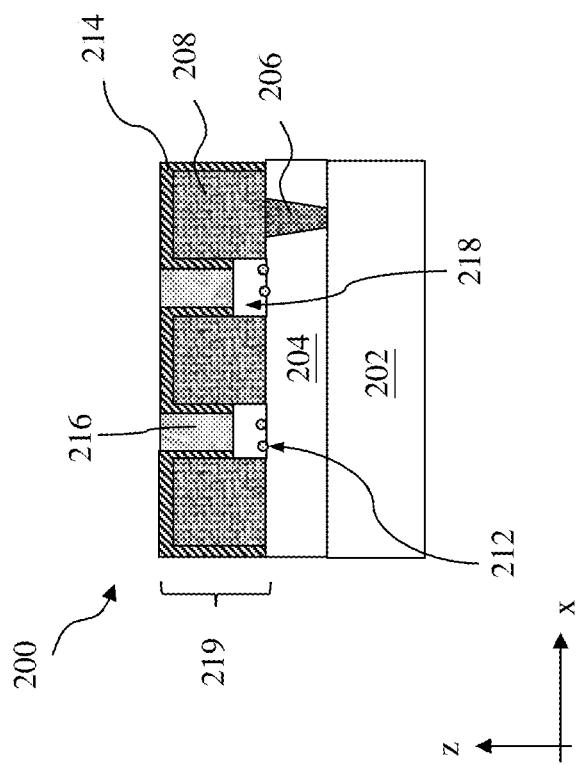

At operation 108, the method 100 (FIG. 1) deposits an inter-metal dielectric (IMD) layer 216 over the OBL 212 and the dielectric barrier layer 214, such as shown in FIG. 2E. Referring to FIG. 2E, the IMD layer 216 fills the remaining portions of the trenches 210 that are not occupied by the OBL 212 and the dielectric barrier layer 214. Further, the IMD layer 216 is deposited to overflow above the metallic features 208. In various embodiments, the IMD layer 216 includes a dielectric material including, for example, silicon oxide, silicon nitride, silicon oxynitride, tetraethylorthosilicate (TEOS) formed oxide, phosphosilicate glass (PSG), borophosphosilicate glass (BPSG), low-k dielectric material, other suitable dielectric material, or combinations thereof. Example low-k dielectric materials include fluoride doped silica glass (FSG), boron doped silica glass (BSG), carbon doped silicon oxide, xerogel, aerogel, amorphous fluorinated carbon, parylene, benzocyclobutene (BCB), polyimide, other low-k dielectric material, or combinations thereof. In the depicted embodiment, the IMD layer 216 is a dielectric layer that includes a low-k dielectric material (generally referred to as a low-k dielectric layer). For example, the IMD layer 216 includes a material having a dielectric constant (k value) lower than or equal to 3. In some embodiments, the IMD layer 216 includes an extreme low-k dielectric material, for example, with k lower than 2.3. Having a low dielectric constant in the IMD layer 216 advantageously reduces the stray capacitance between the metallic features 208. Further, the IMD layer 216 may include a porous material where the pores in the IMD layer 216 help the small molecules of the OBL to scape there through. The IMD layer 216 may be deposited using CVD, PECVD, FCVD, or other suitable methods. In some embodiments, the IMD layer 216 is formed by an FCVD process that includes, for example, depositing a flowable material (such as a liquid compound) over the device 200 and converting the flowable material to a solid material by a suitable technique, such as thermal annealing and/or UV irradiation treating.

At operation 110, the method 100 (FIG. 1) performs a CMP process to the IMD layer 216. Referring to FIG. 2F, the operation 110 planarizes the IMD layer 216 and partially removes it until the top surface of the dielectric barrier layer 214 is exposed. In an embodiment, the dielectric barrier layer 214 may be used as an etch stop for CMP end point detection. As a result of the operation 110, the top surface of the dielectric barrier layer 214 and the top surface of the IMD layer 216 become substantially co-planar.

Figure 2G:
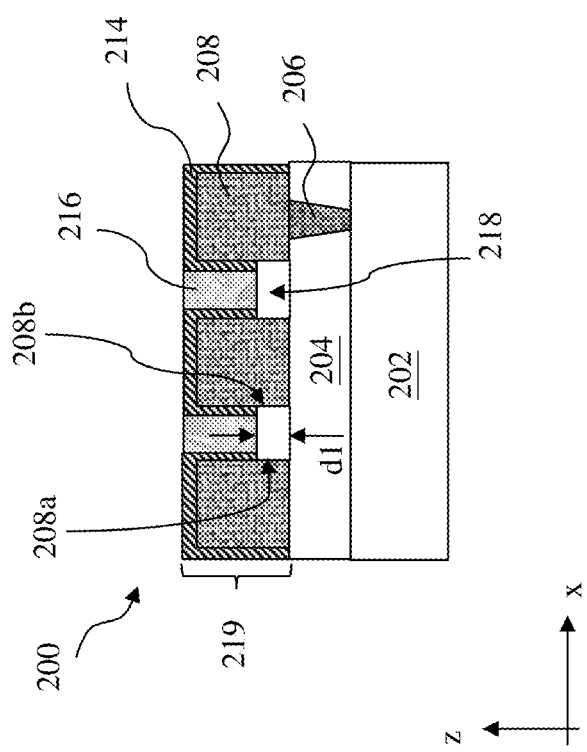

At operation 112, the method 100 (FIG. 1) removes the OBL 212 from the device 200, thereby forming an interconnect layer 219 as illustrated in FIG. 2G. In an embodiment, the operation 112 includes exposing the device 200 to UV lights such that the OBL 212 decomposes and turns into vapor molecules. To further such embodiment, the OBL 212 includes photolabile protecting groups such as carbamates, N-nitrosodimethylamine, or other suitable functional groups that are amenable to photodissociation, photolysis, or photodecomposition. In another embodiment, the operation 112 includes heating the device 200 to an elevated temperature such that the OBL 212 decomposes and turns into vapor. The vapor molecules are small enough to diffuse through the IMD layer 216, particularly when the IMD layer 216 is of a porous material. In an embodiment, the operation 112 heats the device 200 to a temperature below 400° C. such as in a range from 300° C. to 400° C., in a range from 200° C. to 300° C., or in a range below 200° C. The selected temperature depends on the material of the OBL 212. Generally, if the molecules in the OBL 212 are larger, then a higher temperature is selected; and if the molecules in the OBL 212 are smaller, then a lower temperature is selected. Generally, a low temperature is more desired than a high temperature in order to preserve the integrity of the metallic features 208 and 206 as well as various conductors in the substrate 202. Referring to FIG. 2G, after the OBL 212 is removed, the space formerly occupied by the OBL 212 becomes an air gap 218. The air gap 218 is surrounded by the dielectric layer 204 at its base, by the metallic features 208 at its sidewalls, and by the dielectric barrier layer 214 and the IMD layer 216 at its ceiling. The air gap 218 advantageously reduces the stray capacitance associated with the metallic features 208. Particularly, the lower portion of the surfaces 208a and 208b are not covered by any of the dielectric layers 214 and 216. This eliminates the concerns of metal diffusion and metal leakage through those parts of the metal surfaces. The upper portion of the surfaces 208a and 208b are covered by the dielectric barrier layer 216. The space between the upper portion of the metallic features 208 are fully filled by the dielectric barrier layer 216 and the IMD 216. The layers 214 and 216 collectively provide mechanical support to the metallic features 208. The interconnect layer 219 includes the discontinuous dielectric barrier layer 214, the IMD layer 216, the metallic features 208, and the air gaps 218. In embodiments, the air gap 218 may have a height d1 (along the "z" direction) in a range from about 2 Å to about 100 Å. The importance of d1 being in this range has been discussed above. In some embodiments, the OBL 212 is not completely removed and some residues of the OBL 212 remain in the air gap 218, an example of which is illustrate in FIG. 2H.

Figure 2J:
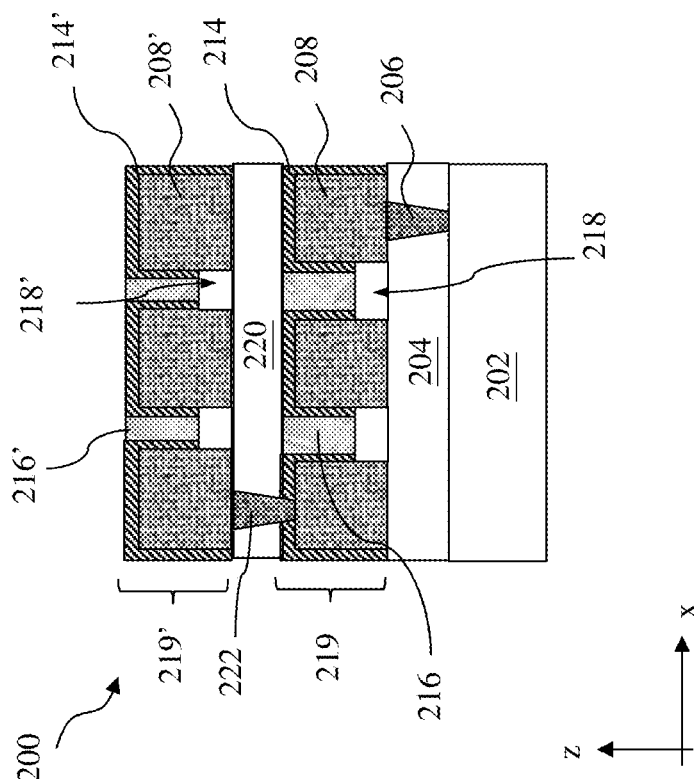
Figure 2I:
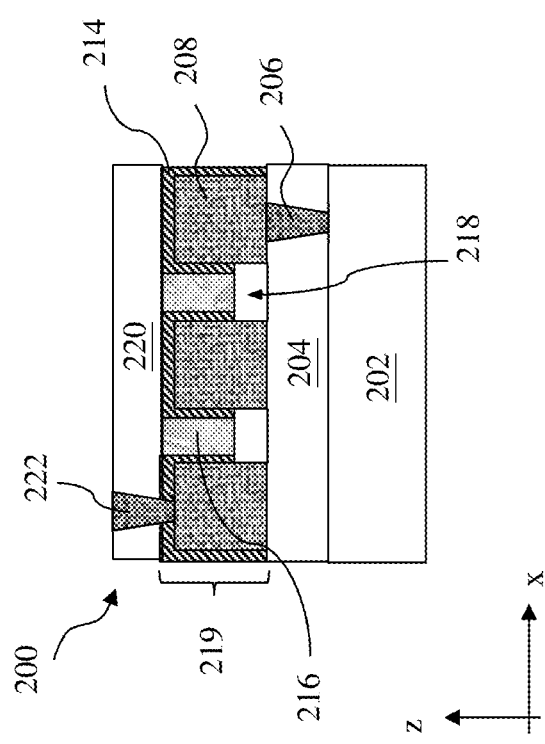

At operation 114, the method 100 (FIG. 1) performs further fabrication steps to the device 200. For example, it may form one or more dielectric layers 220 over the interconnect layer 219 and form one or more metallic features 222 over the metallic features 208 and electrically connecting to the metallic features 208, such as shown in FIG. 2I. The method 100 may form the dielectric layers 220 and the metallic features 222 using a damascene process or a reverse patterning process. In an embodiment where the operation 114 uses a damascene process, the dielectric layers 220 are deposited first. Then, trenches (or holes) are etched into the dielectric layer(s) 220 and through the dielectric barrier layer 214 to expose the metallic features 208. Subsequently, one or more metallic materials are deposited into the trenches to form the metallic features 222. In an embodiment where the operation 114 uses a reverse patterning process, the dielectric barrier layer 214 is patterned (through photolithography and etching processes) to form holes that expose the metallic features 222. Then, a metal layer is deposited over the interconnect layer 219 and filling the holes in the dielectric barrier layer 214. Subsequently, the metal layer is patterned to form the metallic features 222. Finally, the dielectric layer 220 is deposited to surround the metallic features 222. In an embodiment, the dielectric layer 220 and the metallic features 222 are configured with materials that are similar to those in the dielectric layer 204 and the metallic features 206, respectively. The method 100 may proceed to forming another interconnect layer 219' over the dielectric layer 220, such as illustrated in FIG. 2J. For example, the method 100 may form metal lines (like the metallic features 208) over the dielectric layer 220 and repeat the operations 104 through 112 to form the interconnect layer 219' with metallic features 208' isolated by dielectric barrier layer 214', IMD layer 216', and air gaps 218'. The metallic features 208', the dielectric barrier layer 214', the IMD layer 216', and the air gaps 218' can be formed in the same way as the metallic features 208, the dielectric barrier layer 214, the IMD layer 216, and the air gaps 218, respectively. The method 100 may repeat the above operations until a multi-layer interconnect structure is formed for the device 200.

Although not intended to be limiting, one or more embodiments of the present disclosure provide many benefits to an integrated circuit and the formation thereof. For example, two adjacent metal features (e.g., metal lines) in an interconnect layer of an IC can be provided with an air gap and without a dielectric barrier layer at the lower portions of the metal features while the upper portions of the metal features are isolated by a dielectric barrier layer and an inter-metal dielectric layer. The air gap reduces the stray capacitance as well as the electrical leakage between the metal features. This provides a new approach to forming interconnect layers with improved performance for new generations of ICs. Embodiments of the present disclosure can be readily integrated into existing manufacturing flow.

In one example aspect, the present disclosure is directed to a method for semiconductor manufacturing. The method includes providing a structure having a substrate, a dielectric layer over the substrate, and two metallic features over the dielectric layer. The method further includes forming an organic blocking layer (OBL) over the dielectric layer and between lower portions of the two metallic features, wherein sidewall surfaces of the lower portions of the two metallic features are covered by the OBL and sidewall surfaces of upper portions of the two metallic features are not covered by the OBL. The method further includes depositing a dielectric barrier layer over top surfaces of the metallic features and over the sidewall surfaces of the upper portions of the metallic features, wherein at least a portion of a top surface of the OBL is not covered by the dielectric barrier layer. The method further includes forming an inter-metal dielectric (IMD) layer laterally between the two metallic features and above the OBL and removing the OBL, leaving an air gap above the dielectric layer, below the dielectric barrier layer and the IMD layer, and laterally between the lower portions of the two metallic features.

In an embodiment of the method, the forming of the IMD layer includes depositing an IMD material over the dielectric barrier layer and the OBL and performing a chemical-mechanical planarization (CMP) process to the IMD material until a top surface of the dielectric barrier layer is exposed. In some embodiment of the method, the OBL includes one of: small molecules with a silanol functional group, a polymer, or an organometallic compound.

In some embodiment of the method, the forming of the OBL includes a chemical vapor deposition (CVD) process, a molecular layer deposition (MLD) process, a spin coating process, a dipping process, a blade-coating process, or an immersion process. In some embodiment, the dielectric barrier layer includes a metal nitride, a metal oxide, or a metal silicide. In some embodiment, the removing of the OBL applies a thermal process or a UV irradiation process. In some embodiment, the metallic features include ruthenium, tungsten, molybdenum, titanium, cobalt, or aluminum. In some embodiment, the method further includes forming a metal layer above the dielectric barrier layer and the IMD layer, wherein the metal layer electrically connects to at least one of the two metallic features.

In another example aspect, the present disclosure is directed to a method for semiconductor manufacturing. The method includes providing a structure having a substrate, a dielectric layer over the substrate, and two metallic features over the dielectric layer, wherein a trench is provided above the dielectric layer and between the two metallic features. The method further includes forming an organic blocking layer (OBL) that fills a lower portion of the trench, wherein the OBL is bonded to the dielectric layer through chemical bonds. The method further includes depositing a dielectric barrier layer over top surfaces of the metallic features and over sidewall surfaces of the metallic features exposed in an upper portion of the trench, wherein at least a portion of a top surface of the OBL is not covered by the dielectric barrier layer. The method further includes depositing an inter-metal dielectric (IMD) layer over the dielectric barrier layer and the OBL; performing a chemical-mechanical planarization (CMP) process to the IMD layer until a top surface of the dielectric barrier layer is exposed; and removing the OBL, leaving an air gap in the lower portion of the trench and below the dielectric barrier layer and the IMD layer.

In some embodiment of the method, the OBL includes one of: small molecules with a silanol functional group, a polymer, or an organometallic compound. In some embodiment, the forming of the OBL includes a chemical vapor deposition (CVD) process, a molecular layer deposition (MLD) process, or a wet coating process. In a further embodiment, the wet coating process includes applying a solution to the trench wherein the solution includes the OBL and a solvent. In a further embodiment, the solvent includes a protic, a polar aprotic, or a non-polar aprotic solvent.

In some embodiment of the method, the dielectric layer includes silicon oxide. In some embodiment, the dielectric barrier layer includes $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, TaN, or TiN.

In yet another example aspect, the present disclosure is directed to a semiconductor structure that includes a substrate; a dielectric layer over the substrate; and two metallic features over the dielectric layer, wherein a first surface of one of the metallic features faces a second surface of the other one of the metallic features. The semiconductor structure further includes an air gap above the dielectric layer and between the two metallic features, wherein a lower portion of the first surface and a lower portion of the second surface are exposed in the air gap. The semiconductor structure further includes a dielectric barrier layer above the air gap, wherein a first portion of the dielectric barrier layer is disposed on an upper portion of the first surface and a second portion of the dielectric barrier layer is disposed on an upper portion of the second surface. The semiconductor structure further includes a dielectric feature above the air gap and laterally between the first and the second portions of the dielectric barrier layer, wherein the dielectric barrier layer and the dielectric feature include different materials.

In an embodiment, the semiconductor structure further includes a conductive via in the dielectric layer and electrically connecting to one of the metallic features. In some embodiment of the semiconductor structure, the metallic features include ruthenium, tungsten, molybdenum, titanium, cobalt, or aluminum. In some embodiment, the dielectric barrier layer includes a high-k dielectric material and the dielectric feature includes a low-k dielectric material. In some embodiment, the dielectric barrier layer includes a metal nitride, a metal oxide, or a metal silicide, and the dielectric feature includes a porous material having silicon oxide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first dielectric layer;
   a first metallic feature over the first dielectric layer;
   an air gap over the first dielectric layer and adjacent to the first metallic feature, wherein a lower portion of the first metallic feature is exposed in the air gap;
   a second dielectric layer disposed above the air gap and on a sidewall of the first metallic feature; and
   a third dielectric layer disposed above the air gap and on a sidewall of the second dielectric layer, wherein the third and the second dielectric layers are substantially co-planar.

2. The semiconductor structure of claim 1, further comprising a second metallic feature over the first dielectric layer and adjacent to the air gap, wherein a lower portion of the second metallic feature is exposed in the air gap.

3. The semiconductor structure of claim 2, wherein the first and the second metallic features are substantially co-planar.

4. The semiconductor structure of claim 2, further comprising a fourth dielectric layer disposed above the air gap and on a sidewall of the second metallic feature.

5. The semiconductor structure of claim 4, wherein the third and the fourth dielectric layers are substantially co-planar.

6. The semiconductor structure of claim 4, wherein bottom surfaces of the second, the third, and the fourth dielectric layers comprising a top surface of the air gap.

7. The semiconductor structure of claim 4, further comprising a fifth dielectric layer disposed over the second, the third, and the fourth dielectric layers, a third metallic feature extending through the fifth dielectric layer and the second dielectric layer and electrically contacting the first metallic feature.

8. The semiconductor structure of claim 1, further comprising a second metallic feature extending through the first dielectric layer and electrically contacting the first metallic feature.

9. The semiconductor structure of claim 1, wherein the second dielectric layer includes a high-k dielectric material and the third dielectric layer includes a low-k dielectric material.

10. The semiconductor structure of claim 9, wherein the second dielectric layer includes a metal nitride, a metal oxide, or a metal silicide, and the third dielectric layer includes a porous material having silicon oxide.

11. A semiconductor structure, comprising:
a first dielectric layer;
a first metallic feature over the first dielectric layer;
a first air gap over the first dielectric layer and exposing a lower portion of the first metallic feature;
a second dielectric layer disposed above the first air gap and on top and sidewall surfaces of the first metallic feature;
a third dielectric layer disposed above the first air gap and on a sidewall of the second dielectric layer;
a fourth dielectric layer disposed over the second and the third dielectric layers;
a second metallic feature extending through the fourth and the second dielectric layers and contacting the first metallic feature;
a third metallic feature over the second metallic feature and over the fourth dielectric layer; and
a second air gap over the fourth dielectric layer and exposing a lower portion of the third metallic feature.

12. The semiconductor structure of claim 11, wherein the second metallic feature electrically connecting the first and the third metallic features.

13. The semiconductor structure of claim 11, further comprising a fourth metallic feature over the fourth dielectric layer, wherein the second air gap exposes a lower portion of the fourth metallic feature.

14. The semiconductor structure of claim 13, further comprising a fifth metallic feature over the first dielectric layer, wherein the first air gap exposes a lower portion of the fifth metallic feature.

15. The semiconductor structure of claim 11, further comprising:
a fifth dielectric layer disposed above the second air gap and on top and sidewall surfaces of the third metallic feature; and
a sixth dielectric layer disposed above the second air gap and on a sidewall of the fifth dielectric layer.

16. The semiconductor structure of claim 15, wherein the second and the fifth dielectric layers each include a high-k dielectric material and the third and the sixth dielectric layers each include a low-k dielectric material.

17. A method for semiconductor manufacturing, comprising:
providing a structure having a substrate, a first dielectric layer over the substrate, and a metal layer over the first dielectric layer;
forming an organic blocking layer (OBL) over the first dielectric layer and adjacent to a lower portion of the metal layer, wherein a top surface of the OBL is below a top surface of the metal layer;
depositing a high-k dielectric layer over the top surface and sidewall surfaces of the metal layer and over the top surface of the OBL, wherein at least a portion of the top surface of the OBL is not covered by the high-k dielectric layer;
depositing a low-k dielectric layer on the top surface of the OBL and on sidewall surfaces of the high-k dielectric layer; and
vaporizing the OBL, leaving an air gap above the first dielectric layer and below the high-k dielectric layer and the low-k dielectric layer.

18. The method of claim 17, after the depositing of the low-k dielectric layer and before the vaporizing of the OBL, further comprising:
performing a chemical-mechanical planarization (CMP) process to the low-k dielectric layer.

19. The method of claim 17, wherein the OBL includes one of: small molecules with a silanol functional group, a polymer, or an organometallic compound, and the vaporizing includes applying a thermal process or a UV irradiation process.

20. The method of claim 17, before the forming of the OBL, further comprising patterning the metal layer to form trenches, wherein the OBL is formed inside the trenches.

* * * * *